United States Patent
Krautschneider et al.

(10) Patent No.: US 6,518,628 B1
(45) Date of Patent: Feb. 11, 2003

(54) INTEGRATED CMOS CIRCUIT CONFIGURATION, AND PRODUCTION OF SAME

(75) Inventors: Wolfgang Krautschneider, Hohenthann (DE); Franz Hofmann, München (DE); Lothar Risch, Neubiberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/423,864

(22) PCT Filed: Apr. 24, 1998

(86) PCT No.: PCT/DE98/01154
§ 371 (c)(1),
(2), (4) Date: Nov. 15, 1999

(87) PCT Pub. No.: WO98/52211
PCT Pub. Date: Nov. 19, 1998

(30) Foreign Application Priority Data

May 15, 1997 (DE) .......................... 197 20 463

(51) Int. Cl.[7] .................. H01L 29/76; H01L 29/94; H01L 31/062; H01L 31/113; H01L 31/119

(52) U.S. Cl. ............... 257/372; 257/394; 257/400; 438/214

(58) Field of Search ................ 257/372, 394, 257/400, 371, 401; 438/214, 220, 223, 224, FOR 195, FOR 314

(56) References Cited

U.S. PATENT DOCUMENTS 4,799,097 A   1/1989  Szluk et al. ............. 357/42
5,497,023 A * 3/1996  Nakazato et al. .......... 257/394

FOREIGN PATENT DOCUMENTS

DE   34 27 285 C2   2/1985
EP   0 535 681 A2   4/1993
EP   0 563 921 A2   10/1993

OTHER PUBLICATIONS

XP–002082101 CMOS Inverter Structure pp. 7046–7048.
XP–002082102 Applicatin of the Anisotropic Etching of Silicon to the Development of Complementary Structures, Declercq, pp. 519–522.
Dreidimensionale Ks aus gestapelten Bauelementen, pp. 21–22.
A New C–Mos Technology Using Anisotropic Etching of Silicon, Declercq, pp. 191–197.
Complex 3D CMOS Circuits Based on a Triple–Decker Cell, Roos et al., pp. 1067–1072.
Ibm Technical Discosure Bulletin, vol. 27, No. 12, May 1985, pp. 6968–6970.

* cited by examiner

Primary Examiner—Long Pham
Assistant Examiner—Neal Berezny
(74) Attorney, Agent, or Firm—Schiff Hardin & Waite

(57) ABSTRACT

An integrated CMOS circuit arrangement and a method of manufacturing same, which includes both a first MOS transistor and a second MOS transistor complementary thereto, wherein one of the MOS transistors is arranged at the floor of a trench and the other is arranged at the principal surface of a semiconductor substrate. The MOS transistors are arranged relative to one another such that a current flow through the MOS transistors respectively occurs substantially parallel to a sidewall of the trench that is arranged between the MOS transistors.

4 Claims, 4 Drawing Sheets

INTEGRATED CMOS CIRCUIT CONFIGURATION, AND PRODUCTION OF SAME

BACKGROUND OF THE INVENTION

Field of the Invention

The present invention relates to an integrated CMOS circuit arrangement, and method of manufacturing same, having a first MOS transistor formed at a surface of an associated substrate as well as a second MOS transistor which is complementary to the first arranged at the floor of a trench of the substrate.

In CMOS circuits, it must be assured a given increasing integration density a that the n-channel MOS transistors and the p-channel MOS transistors of logical gates are insulated from one another. In particular, the latch-up effect, or a through-connection of a parasitic thyristor between a first and a second supply voltage, must be prevented. To that end, the n-channel or, p-channel MOS transistors, which are potentially arranged in correspondingly doped wells, are surrounded by insulation regions. Additional well or substrate contactings, for example in the form of guard rings, can be provided as a measure against latch-up effects.

It has been proposed a for increasing the packing density a to respectively combine the n-channel MOS transistors and a p-channel MOS transistors in groups in CMOS circuits (see, for example, S. Saito et al., "A 1-Mbit CMOS DRAM with Fast Page Mode and Static Column Mode", IEEE J. Sol.-State Circ., Vol. SC-20, page 903, 1985). As a result thereof, the necessary minimum spacing between a n-doped well and n-doped source/drain regions must be adhered to a not between the individual MOS transistors a but only between the corresponding groups. The space requirement per transistor is thereby reduced.

It also the been proposed a see, for example, A. G. Lewis et al., "Polysilicon TFT Circuit and Performance", IEEE J. Sol.-State Circ., Vol. 27, page 1833, 1992), to construct CMOS circuits on the basis of thin-film transistors. The substrates of the n-channel MOS transistors and of the p-channel MOS transistors are thereby implemented separate from one another. Given this structure, an adequate distance for the insulation of the entire arrangement must be adhered to between the source/drain regions of the n-channel MOS transistors and the p-channel source/drain region of the MOS transistors.

Finally, it has been proposed (see IBM TDB, Vol. 27, No. 12, May 1985, pages 6968 through 6970) to apply an insulating layer for the manufacture of a CMOS circuit on a silicon substrate. A polysilicon layer is grown at the surface of the insulating layer and is locally converted into a monocrystalline layer by lateral epitaxy. The n-channel MOS transistors are formed in the silicon substrate. P-channel MOS transistors are formed in the layer that has been grown. The transistors are respectively insulated by insulation regions surrounding them. In the finished arrangement, the n-channel MOS transistors and the p-channel MOS transistors are completely insulated from one another by the insulating layer and the insulation regions. Fundamentally, latch-up cannot not occur because of the insulating layer. The surface requirement of this CMOS circuit, however, is relatively great due to the insulation regions surrounding the transistors.

The present invention is therefore, directed to the development of an integrated CMOS circuit arrangement, and method which exhibits enhanced packing density.

SUMMARY OF THE INVENTION

In the integrated CMOS circuit arrangement of the present invention at least one trench is provided in a principal surface of a semiconductor substrate. A first MOS transistor is arranged at the principal surface and a second MOS transistor is arranged at the floor of the trench. The second MOS transistor is complementary to the first MOS transistor. The first MOS transistor and the second MOS transistor are thereby arranged such that a current flux through the MOS transistors respectively occurs substantially parallel to a sidewall of the trench that is arranged between the first MOS transistor and the second MOS transistor. The insulation between the source/drain regions of the first MOS transistor and the source/drain regions of the second MOS transistor in this circuit arrangement is assured by the sidewall of the trench. No lateral space requirement parallel to the principal surface is therefore needed for the insulation between the first MOS transistor and the second MOS transistor. The first MOS transistor and the second MOS transistor can adjoin one another in the projection onto the principal surface. In this way, an enhanced packing density is also achieved in the invention CMOS circuit arrangements.

For improving the latch-up strength, it is advantageous to provide an insulating layer in the semiconductor substrate under the first MOS transistor and above the second MOS transistor. This means that the distance of the insulating layer from the principal surface is less than the depth of the trench. The insulating layer is, thus, interrupted by the trench. The insulating layer can be formed with a highly doped layer that is doped with a conductivity type opposite that of the source/drain regions of the first MOS transistor. Alternatively, the insulating layer can be provided of a dielectric material, for example of $SiO_2$ or $Si_3N_4$.

A line is preferably provided that proceeds transversely relative to the trench. This line contains a first gate electrode for the first MOS transistor and a second gate electrode for the second MOS transistor. In this way, an electrical connection is formed between the first gate electrode and the second gate electrode without having to require the manufacture of an additional, aligned connection between the first gate electrode and the second gate electrode.

For contacting the source/drain regions of the second MOS transistor, which is arranged at the floor of the trench, it is advantageous to provide a doped, buried layer in the semiconductor substrate under the second MOS transistor. A vertical sub-region of the source/drain region of the second MOS transistor to be contacted then extends down to the buried layer. This vertical sub-region can be manufactured by ion implantation. The buried layer is connected to the respectively required potentials via one or more contacts. As a result there the corresponding source/drain regions are connectable to the respective potentials.

For manufacturing the CMOS circuit arrangement, a region doped with a first conductivity type is preferably formed in the semiconductor substrates wherein this region adjoins a principal surface. A trench is formed whose depth is greater than the depth of the region doped with the first conductivity type. A gate dielectric is formed that at least covers the floor of the trench and the principal surface. A conductive layer is deposited that fills up the trench. Upon employment of a mask that defines a first gate electrode for the first MOS transistor and a second gate electrode for the second MOS transistor, the conductive layer is etched through in the region of the principal surface in a first etching step. As such the floor of the trench remains covered by the conductive layer. The first gate electrode for the first MOS transistor is thereby formed. Subsequently, source/drain regions are formed for the first MOS transistor. The floor of the trench is thereby covered by the conductive layer, which acts as mask. Subsequently, the conductive layer is also etched through at the floor of the trench in a second etching step. Wherein the second gate electrode is formed. For forming source/drain regions for the second MOS transistor, a diffusion source is generated at the uncovered floor of the trench. The source/drain regions of the second MOS transistor are formed by drive-out.

The diffusion source preferably is formed by applying and flowing a doped silicate glass layer. In this case, the diffusion source arises self-aligned only at the floor of the trench.

A line that proceeds transversely over both the first MOS transistor and the second MOS transistor and that contains both the first gate electrode and the second gate electrode preferably is formed from the conductive layer. As a result, the first gate electrode and the second gate electrode are electrically connected to one another in self-aligning fashion. The connection between the first gate electrode and the second gate electrode is required for logical gates.

It is advantageous for forming a logical gate to arrange the first MOS transistor and the second MOS transistor such that the source/drain regions of the first MOS transistor and of the second MOS transistor, which must be connected electrically to one another in the gate, are arranged next to one another in the projection onto the principal surface. For connecting these source/drain regions, a via hole is opened that overlaps the two source/drain regions to be connected. The source/drain regions are connected to one another by a contact that fills the via hole.

For improving the latch-up strength, it lies within the scope of the present invention to employ an SOI substrate as the semiconductor substrate, this, including a silicon wafer, an insulating layer arranged on the silicon wafer and a monocrystalline silicon layer arranged on the insulating layer. In this case, the trench is formed to such a depth that it extends through the monocrystalline silicon layer and the insulating layer into the silicon wafer. The insulating layer in this arrangement prevents a latch-up between the first MOS transistor and the second MOS transistor.

It also lies within the scope of the present invention to provide more than one trench. Further, the cross section of the trench or trenches can be selected stripe-shaped, so that a plurality of MOS transistors are respectively arranged at the floor of the trench and on the principal surface between neighboring trenches. The configuration of the CMOS circuit in this case occurs via the arrangement of the MOS transistors as well as via the structuring of the conductive layer for forming the gate electrodes. It further lies within the scope of the present invention to provide MOS transistors that neighbor one another at the floor of the trench a or at the principal surface a and that are to be connected in series with a common source/drain region via which they are interconnected in series. Both different gate configurations as well as transfer gate circuits or logic circuits can be realized in the CMOS circuit arrangement.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
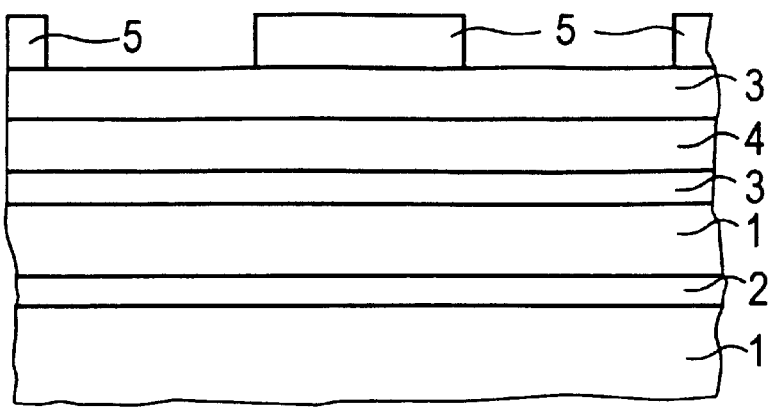
FIG. 1 shows a section through a semiconductor substrate with a buried, doped layer, a p-doped well, a channel stop layer and a trench mask, therefor in accordance with the teachings of the present invention.

Referring to FIG. 1, a buried, doped layer 2 is formed in a semiconductor substrate 1, for example a monocrystalline, n-doped silicon wafer having a basic doping of approximately $10^{15}$ cm$^{-3}$, by implantation with boron with a dose of $10^{15}$ cm$^{-3}$ and an energy of approximately 400 keV. The buried doped layer 2 must be doped highly enough that it is suitable as a buried lead.

Subsequently, a p-doped well 3 is formed by ion implantation with boron with an energy of 120 keV and a dose of approximately $10^{13}$ cm$^{-2}$ upon employment of a photo resist mask. The p-doped well 3 exhibits a depth of, for example, 0.3 μm. A channel stop layer 4 is formed by a further implantation with boron with a dose of approximately $4\times10^{13}$ cm$^{-2}$ and an energy of approximately 100 keV, this channel stop layer 4 lying within or below the p-doped well 3. The p-doped well 3 adjoins a principal surface of the semiconductor substrate 1.

Figure 2:
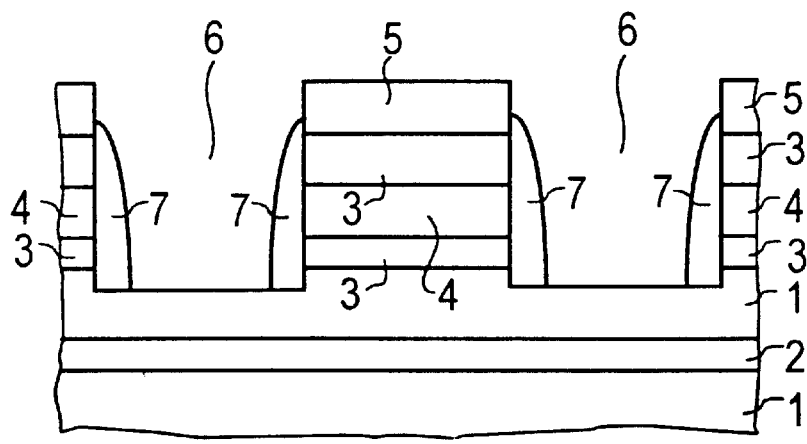
FIG. 2 shows a cross-sectioned view through the semiconductor substrate after a trench etching and after formation of insulating spacers at sidewalls of the trenches.

A trench mask is formed by depositing a SiO$_2$ layer in a TEOS process in a thickness of, for example, 50 nm through 150 nm and subsequent structuring of the SiO$_2$ layer with the assistance of photolithographic process steps. The trench mask 5 is employed as a hard mask for a following trench etching. The trench etching subsequently is implemented in an anisotropic etching process, for example with Hbr/Cl$_2$/He. As said two trenches 6 are thereby formed. The trenches respectively extend into the semiconductor substrate 1 under the p-doped well 3. They thus cross the p-well 3 and the channel stop layer 4 (see FIG. 2). The trenches 6 both a depth of, for example, 0.5 μm. The trenches 6 both a rectangular cross section with a width of approximately 0.5 μm and a length of, for example, 10 μm.

Subsequently, an SiO$_2$ layer is formed by deposition in a TEOS method in a thickness of, for example, 40 nm and 80 nm with substantially conformal edge coverage a and. Insulating spacers 7 are subsequently formed at the sidewalls of the trenches 6 by anisotropic re-etching. The insulating spacers 7 cover the uncovered surface of the p-doped well 3 and of the channel stop layer 4.

Thereafter, an ion implantation is implemented, with, for example boron with an energy of, 25 keV and a dose of, $1.5\times10^{12}$ cm$^{-2}$, this serving as channel implantation for an MOS transistor to be produced at the floor of the trenches 6. Subsequently, the insulating spacers 7 at the sidewalls of the trenches 6 are removed by wet-chemical etching; for example, with HF. The trench mask 5 is simultaneously removed.

A further SiO$_2$ layer is then deposited in a TEOS process having substantially conformal edge coverage in a layer thickness of, for example, 80 nm. The SiO$_2$ layer is then anistropically re-etched. Insulating spacers 8 are thereby formed anew at the sidewalls of the trenches 6 (see FIG. 3). A gate dielectric 9 is formed at the floor of the trenches 6 and at the principal surface by thermal oxidation. The gate dielectric 9 is formed in a thickness of, for example, 5 through 10 nm.

Figure 3:
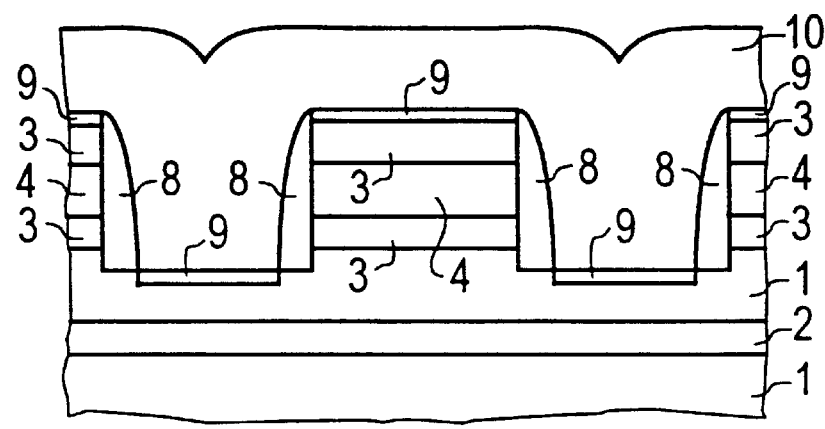
FIG. 3 shows a cross-sectioned view through the semiconductor substrate after removal of the trench mask, after formation of a gate dielectric and after deposition of a conductive layer.

A conductive layer 10 is deposited surface-wide in such a thickness that the trenches 6 are filled therewith (see FIG. 3). Given a width of the trenches 6 of, for example, 0.6 μm, the conductive layer 10 is formed in a thickness of, for example, 500 μm. All materials that are suitable for the manufacture of gate electrodes are suitable for the conductive layer 10. In particular, the conductive layer 10 is produced of doped polysilicon with metal silicide or amorphous silicon with metal silicide. The conductive layer is formed, for example, by deposition of polycrystalline or amorphous silicon and subsequent doping by implantation or diffusion.

Figure 4:
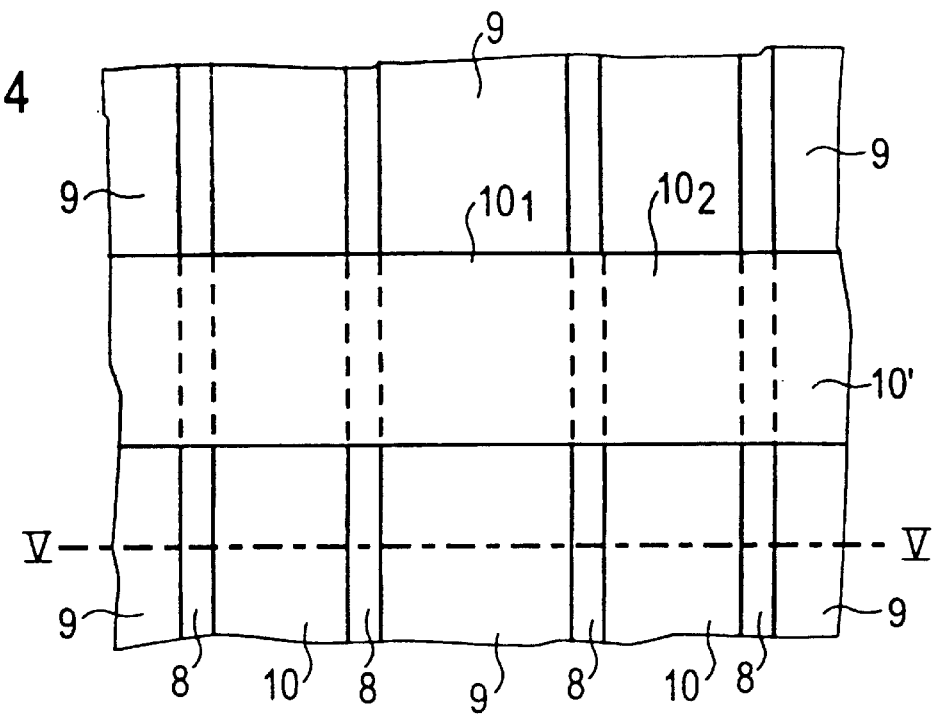
FIG. 4 shows a plan view onto the semiconductor substrate after a first etching step for structuring the conductive layer, wherein the floor of the trench remains covered with the conductive layer.
Figure 5:
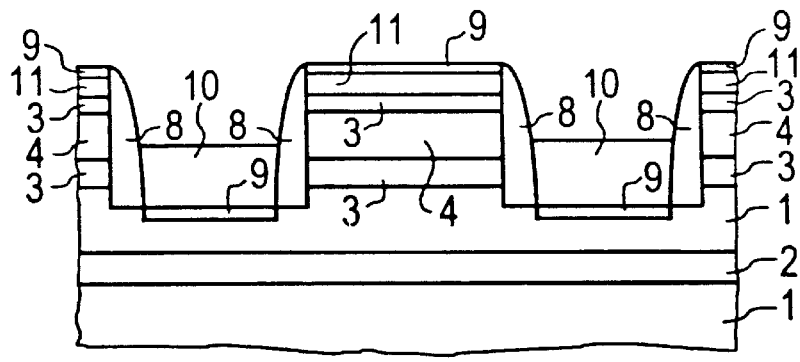
FIG. 5 shows a cross-sectioned view through the semiconductor substrate referenced V—V in FIG. 4.

A photo resist mask subsequently is formed for structuring the conductive layer 10. An anti-reflection layer of, for example, amorphous silicon and amorphous silicon nitride can be applied under the photo resist mask. In a first etching step, for example a dry etching step with Hbr/NF3, the conductive layer 10 is structured such that a first gate electrode 101 arises in the region of the principal surface (see FIG. 4). The surface of the gate dielectric 9 at the principal surface is uncovered to the side of the first gate electrode 101. The gate dielectric 9 at the floor of the trenches, by contrast, remains covered with the material of the conductive layer (see FIG. 5, which shows the section through FIG. 4 referenced V—V). Subsequently, an ion implantation is implemented with, for example, arsenic, wherein by source/drain regions 11 for a first MOS transistor are formed at the principal surface in a self-aligned manner relative to the first gate electrode 101. The source/drain regions 11 are arranged completely in the p-doped well 3 above the channel stop layer 4 (see FIG. 5). They include a dopant concentration of, for example, 1020 cm-3. The gate dielectric 9 located at the principal surface acts as stray oxide in the implantation. The trench floor is masked in the implantation by that part of the conductive layer 10 located there.

In a second etching step in a dry etching process, for example with Hbr/Cl$_2$/HeO$_2$, the conductive layer 10 subsequently is structured further, wherein the surface of the gate dielectric 9 at the floor of the trenches 6 is partially uncovered. A second gate electrode 102 is thereby formed (see FIG. 10). The first gate electrode $10_1$ and the second gate electrode $10_2$ are component parts of a line 10' that is formed by the structuring of the conductive layer 10 in the first etching step and in the second etching step and that proceeds transversely relative to the trench 6 (see FIG. 4).

Figure 6:
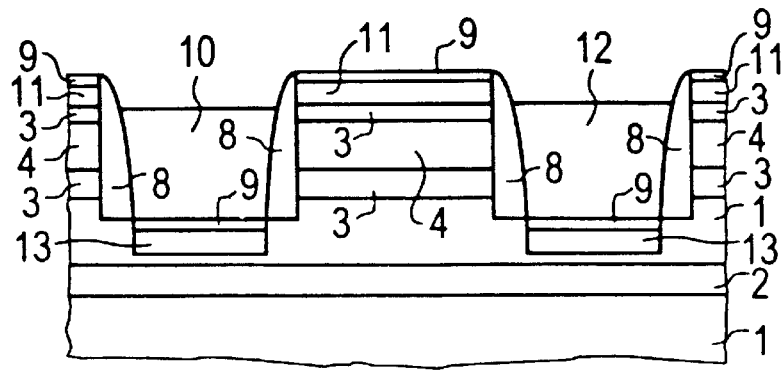
FIG. 6 shows the section through the semiconductor substrate after a second etching step for structuring the conductive layer, wherein the floor of the trench is uncovered after formation of a diffusion source on the floor of the trenches and after formation of source/drain regions at the floor of the trenches.

Subsequently, a borosilicate glass layer is deposited wherein a diffusion source that is only arranged in the trenches 6 is being formed therefrom by slight flowing and re-etching (see FIG. 6). In a high-temperature step, source/drain regions 13 for a second MOS transistor that is arranged at the floor of one of the trenches 6 are formed by drive-out of boron from the diffusion source 12 at the floor of trenches 6 (see FIG. 6).

Figure 7:
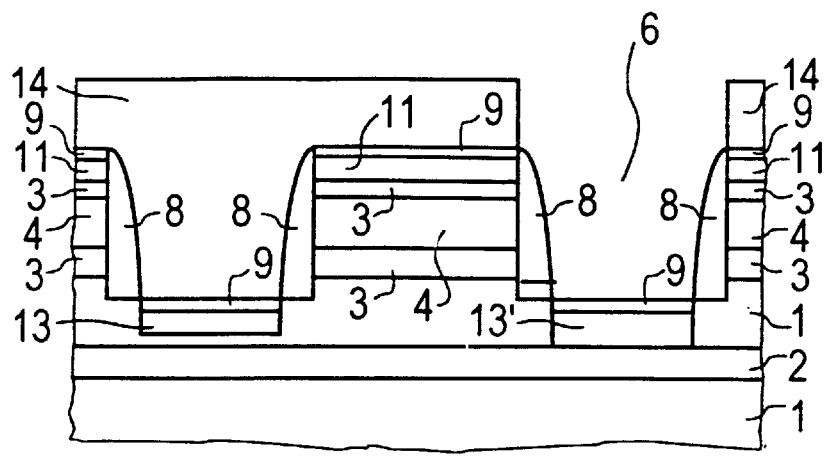
FIG. 7 shows a cross-sectioned view through the semiconductor substrate after removal of the diffusion source and after formation of a mask that leaves a source/drain region at the floor of the trenches uncovered, this to be connected by implantation to the buried, doped layer.

After removal of the diffusion source 12, for example with CHF$_3$, a mask 14 of, for example, photo resist is formed, which includes an opening in the region of one of the source/drain regions 13 for the second MOS transistor that is arranged at the floor of the trenches 6 and that is to be electrically connected to the buried, doped layer 2. To that end, an implantation is implemented with p-doping ions, for example with boron, at an energy of 180 keV or 100 keV and 280 keV and a dose of 10$^{15}$ cm$^{-2}$, wherein a deep source/drain region 13' is formed from the respective source/drain region 13 (see FIG. 7). The deep source/drain region 13' extends down onto the buried, doped layer 2. The channel stop layer 4 acts as insulating layer between the first MOS transistor and the second MOS transistor.

Figure 8:
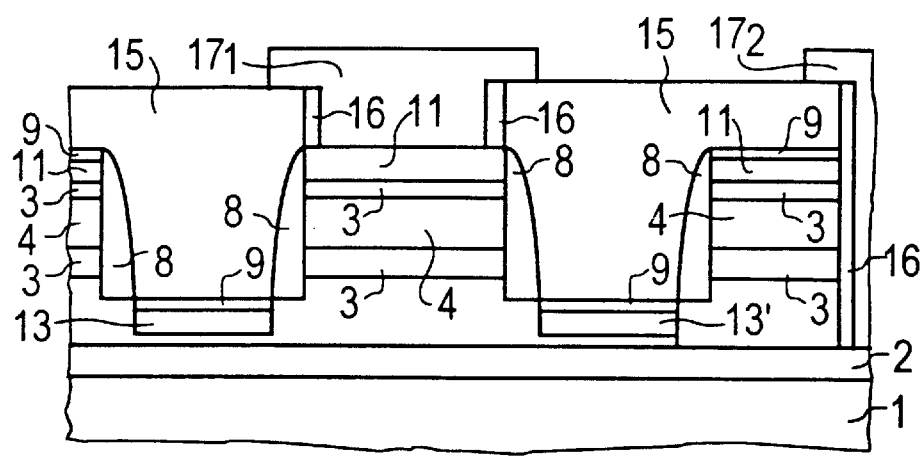
FIG. 8 shows a cross-sectioned view through the semiconductor substrate after formation of a passivation layer, after opening of via holes to both a source/drain region at the principal surface of the semiconductor substrate and the buried, doped layer, as well as after formation of contacts that fill up the via holes.
Figure 9:
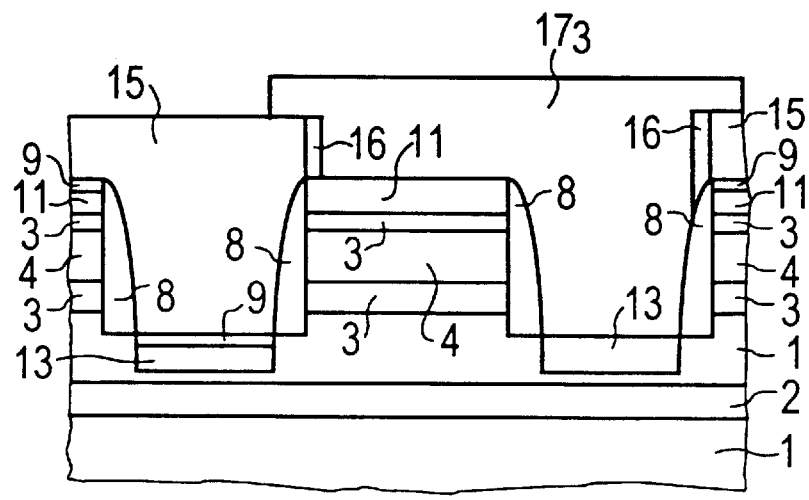
FIG. 9 shows a cross sectional view parallel to FIG. 8 through the semiconductor substrate after opening of a via hole in the passivation layer that overlaps overlaps a source/drain region at the principal surface and a source/drain region at the trench floor and that is provided with a contact that connects the two source/drain regions to one another.
Figure 10:
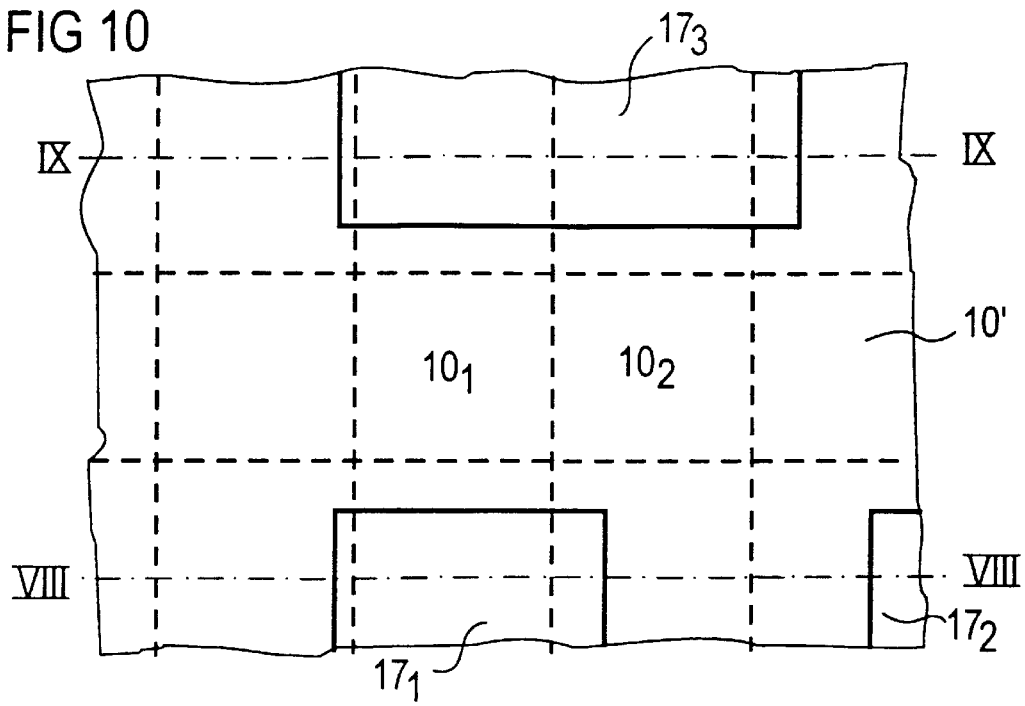
FIG. 10 shows a plan view onto the semiconductor substrate after formation of the contacts shown in the sections in FIGS. 8 and 9. The section shown in FIG. 8 is referenced VIII—VIII in FIG. 10 and the section shown in FIG. 9 is referenced IX—IX in FIG. 10.

After removal of the mask 14 with, for example, photo resist striping, an intermediate oxide layer 15 is deposited. Via holes to one of the source/drain regions 11 for the first MOS transistor, to the buried, doped layer 2 and to the other of the source/drain regions 11 for the first MOS transistor and the source/drain region 13 for the second MOS transistor are opened in the intermediate oxide layer 15. The via holes are provided with sidewall insulations 16; for example, by conformal deposition of a SiO$_2$ layer and re-etching of the SiO2 layer. The sidewall insulations 16 effect, on the one hand, a constriction of the cross section of the appertaining via hole, as a result whereof alignment imprecisions are compensated and shorts connected therewith are avoided and, on the other hand, effects an insulation of the uncovered sidewalls of the p-doped well 3, of the channel stop layer 4 and of the semiconductor substrate 1 in the region of the via hole extending onto the buried, doped layer 2 (see FIG. 8 and FIG. 9). The via holes are provided with contacts. A first contact 171 is formed to one of the source/drain regions 11 for the first MOS transistor (see FIG. 8). A second contact 172 is formed to the buried, doped layer 2. A third contact 173 is formed to the other source/drain region 11 for the first MOS transistor and one of the source/drain regions 13 for the second MOS transistor (see FIG. 9). The third contact 173 electrically connects these two source/drain regions 11, 13. The layout of the contacts 171, 172, 173 is shown in FIG. 10. The sections shown in FIGS. 8 and 9 are entered in FIG. 10 as dot-dashed lines VIII—VIII and, respectively, IX—IX.

Figure 11:
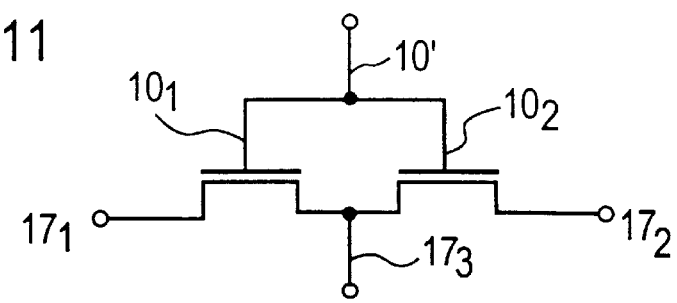
FIG. 11 shows a first equivalent circuit diagram for logic gates explained on the basis of FIGS. 8, 9 and 10.

FIG. 11 shows an equivalent circuit diagram of the logical gate formed by the first MOS transistor and the second MOS transistor. The first contact $17_1$ and the second contact $17_2$ are respectively connected to a first supply voltage and a second supply voltage. The line 10' that contains both the first gate electrode $10_1$ and the second gate electrode $10_2$ represents an input of the logical gate. The third gate $17_3$ represents an output of the logical gate.

Figure 12:
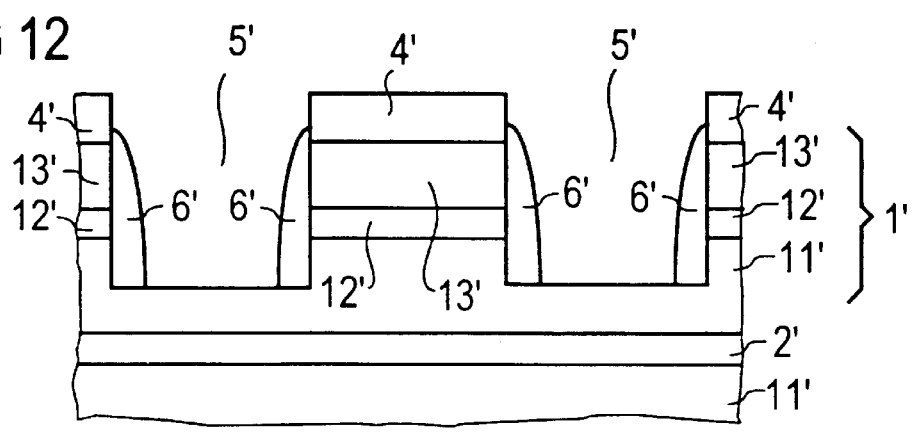
FIG. 12 shows cross-sectional view through a semiconductor substrate that includes a silicon wafer, an insulating layer arranged on the silicon wafer and a monocrystalline silicon layer arranged on the insulating layer and in which a buried, doped layer was formed and in which trenches were etched upon employment of a trench mask.

Alternatively, the CMOS circuit arrangement can be formed in an SOI substrate 1' instead of the semiconductor substrate 1 of monocrystalline silicon (see FIG. 12). The SOI substrate 1' includes a monocrystalline silicon wafer 11' on which an insulating layer 12' of, for example, $SiO_2$ and a monocrystalline silicon layer 13' are arranged. The monocrystalline silicon layer 13' is, for example, p-doped. The silicon wafer 11' is, for example, n-doped. By implantation, a buried, p-doped layer 2' is formed in the silicon wafer 11'.

A trench mask 4' is applied onto the surface of the monocrystalline silicon layer 13'. The trench mask 4' is formed analogous to the trench mask 5 described with reference to FIG. 1.

Trenches 5' that extend into the silicon wafer 11' are formed by anisotropic etching, for example with Hbr and $CHF_3$. The surfaces of the monocrystalline silicon layer 13' and of the insulating layer 12' are uncovered at the sidewalls of the trenches 5'. Spacers 6' are formed at the sidewalls of the trenches 5' by conformal deposition and anisotropic re-etching of a TEOS-$SiO_2$ layer. The structure now corresponds to the structure shown in FIG. 2, wherein the p-doped, monocrystalline silicon layer 13' assumes the role of the p-doped well 3 and the insulating layer 12' assumes the role of the channel stop layer 4. The further manufacture of the CMOS circuit arrangement in this exemplary embodiment occurs analogous to that described with reference to FIGS. 3 through 11. In the finished CMOS circuit arrangement, the first MOS transistor is dielectrically insulated from the second MOS transistor by the insulating layer 12', so that punch-through effects and latch-up effects are effectively suppressed.

It lies within the scope of the invention to modify the exemplary embodiments such that n-channel MOS transistors are arranged at the trench floor and p-channel MOS transistors are arranged at the principal surface. Indeed, although the present invention has been described with reference to specific embodiments, those of skill in the art will recognize that changes may be made thereto without departing from the spirit and scope of the invention as set forth in the hereafter appended claims.

What is claimed is:

1. An integrated CMOS circuit arrangement, comprising:

a semiconductor substrate;

at least one trench formed in a principal surface of the semiconductor substrate;

a first MOS transistor arranged at the principal surface in a region doped with a first conductivity type wherein a current flow through the first MOS transistor occurs substantially parallel to a sidewall of the trench;

a second MOS transistor, that is complementary to the first MOS transistor, arranged at a floor of the trench in a region doped with a second conductivity type which is opposite the first conductivity type wherein a current flow through the second MOS transistor occurs substantially parallel to the sidewall of the trench; and a doped, buried layer having a contact, the buried layer arranged in the semiconductor substrate at a level lower than the second MOS transistor wherein a source/drain region of the second MOS transistor connects to the buried layer.

2. An integrated CMOS circuit arrangement as claimed in claim 1, further comprising:

a doped layer doped with the first conductivity type disposed in the semiconductor substrate at a level lower than the first MOS transistor and at a level higher than over the second MOS transistor, wherein the doped layer exhibits a higher dopant concentration than the region doped with the first conductivity type.

3. An integrated CMOS circuit arrangement as claimed in claim 1, further comprising:

an insulating layer disposed in the semiconductor substrate at a level lower than the first MOS transistor and at a level higher than the second MOS transistor.

4. An integrated CMOS circuit arrangement as claimed in claim 1, further comprising:

a line that proceeds transversely relative to the trench.

* * * * *